(12) United States Patent
Kim

(10) Patent No.: US 10,002,663 B2
(45) Date of Patent: Jun. 19, 2018

(54) NONVOLATILE MEMORY APPARATUS AND RESISTANCE COMPENSATION CIRCUIT THEREOF

(71) Applicant: SK hynix Inc., Icheon-si Gyeonggi-do (KR)

(72) Inventor: Tae Ho Kim, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days. days.

(21) Appl. No.: 15/382,941

(22) Filed: Dec. 19, 2016

(65) Prior Publication Data
US 2018/0040371 A1 Feb. 8, 2018

(30) Foreign Application Priority Data

Aug. 8, 2016 (KR) ........................ 10-2016-0100600

(51) Int. Cl.
*G11C 11/00* (2006.01)
*G11C 13/00* (2006.01)

(52) U.S. Cl.
CPC .......... *G11C 13/003* (2013.01); *G11C 13/004* (2013.01); *G11C 13/0023* (2013.01); *G11C 13/0069* (2013.01)

(58) Field of Classification Search
CPC .............. G11C 13/003; G11C 13/0023; G11C 13/0069

USPC ...................................... 365/148, 63, 189.08
See application file for complete search history.

(56) References Cited

U.S. PATENT DOCUMENTS

| | | | | |
|---|---|---|---|---|
| 5,869,983 A * | 2/1999 | Ilkbahar | ............. | H03K 19/0005 326/32 |
| 2011/0026293 A1* | 2/2011 | Riho | ........................ | G11C 5/02 365/63 |
| 2011/0299340 A1* | 12/2011 | Samachisa | ......... | G11C 13/0007 365/185.21 |
| 2014/0269070 A1* | 9/2014 | Hsiung | .................. | G11C 16/26 365/185.11 |

FOREIGN PATENT DOCUMENTS

KR 1020130021739 A 3/2013
KR 1020160033349 A 3/2016

* cited by examiner

*Primary Examiner* — Vu Le
(74) *Attorney, Agent, or Firm* — William Park & Associates Ltd.

(57) ABSTRACT

A nonvolatile memory apparatus may include a memory cell array including a plurality of memory cells coupled between a plurality of word lines and a plurality of bit lines. The nonvolatile memory apparatus may include and a resistance compensation circuit configured to generate a compensation resistance value according to a position of a memory cell to be accessed.

21 Claims, 15 Drawing Sheets

FIG.6

| Start Addr | End Addr | Add. Resistance | A1 | A2 | A3 | A4 | A5 | A6 | A7 | A8 | H | L | S1 | S2 | S3 | S4 | S5 | S6 |
|---|---|---|---|---|---|---|---|---|---|---|---|---|---|---|---|---|---|---|
| 0x700 | 0x7FF | 0 | X | X | X | X | X | X | X | X | X | X | 0 | 0 | 0 | 0 | 0 | 1 |
| 0x600 | 0x6FF | ¼K | 1 | 1 | 1 | 1 | 1 | 0 | 0 | 0 | P1 | P3 | 1 | 0 | 0 | 0 | 0 | 0 |
| 0x500 | 0x5FF | ½K | 1 | 1 | 0 | 0 | X | X | X | X | P1 | P3 | 1 | 0 | 1 | 0 | 0 | 0 |
| 0x400 | 0x4FF | ¾K | 0 | 1 | 1 | 0 | 1 | 1 | 0 | 0 | P1 | P4 | 1 | 0 | 0 | 1 | 0 | 0 |
| 0x300 | 0x3FF | 1K | 0 | 0 | X | X | X | X | X | X | P1 | P3 | 1 | 0 | 1 | 0 | 0 | 0 |
| 0x200 | 0x2FF | 1¼K | 1 | 1 | 1 | 1 | 1 | 1 | 1 | 0 | P5 | P3 | 0 | 0 | 1 | 0 | 0 | 0 |
| 0x100 | 0x1FF | 1½K | X | 0 | 0 | 1 | 1 | 1 | 1 | 0 | P1 | P4 | 1 | 0 | 0 | 1 | 1 | 0 |
| 0x0 | 0x0FF | 1¾K | 0 | 1 | 1 | 0 | 0 | 0 | 0 | 1 | P1 | P2 | 1 | 1 | 0 | 0 | 0 | 0 |

FIG.8

| Start Addr | End Addr | Add. Resistance | A11 | A12 | A13 | A14 | A15 | A16 | H | L | S11 | S12 | S13 | S14 | S15 | S16 | S17 |
|---|---|---|---|---|---|---|---|---|---|---|---|---|---|---|---|---|---|
| 0x700 | 0x7FF | 0 | X | X | X | X | X | X | X | X | 0 | 0 | 0 | 0 | 0 | 0 | 1 |
| 0x600 | 0x6FF | ¼K | X | X | X | X | X | 0 | P15 | P13 | 0 | 0 | 0 | 0 | 0 | 1 | 0 |
| 0x500 | 0x5FF | ½K | 0 | 1 | 0 | 0 | 1 | 0 | P12 | P14 | 0 | 1 | 0 | 1 | 0 | 0 | 0 |
| 0x400 | 0x4FF | ¾K | 0 | 1 | 0 | 0 | 1 | 1 | P12 | P13 | 0 | 1 | 1 | 0 | 0 | 0 | 0 |
| 0x300 | 0x3FF | 1K | X | 0 | 0 | X | 0 | 1 | P12 | P14 | 0 | 1 | 0 | 1 | 1 | 0 | 0 |
| 0x200 | 0x2FF | 1¼K | X | 0 | 0 | X | 0 | 0 | P12 | P13 | 0 | 1 | 1 | 0 | 0 | 0 | 0 |
| 0x100 | 0x1FF | 1½K | 1 | 1 | 1 | 1 | 1 | 1 | P12 | P11 | 1 | 1 | 0 | 0 | 0 | 0 | 0 |
| 0x0 | 0x0FF | 1¾K | 1 | 0 | 1 | 1 | 1 | 0 | P15 | P11 | 1 | 0 | 0 | 0 | 0 | 1 | 0 |

MC-1

MC-2

MC-3

NONVOLATILE MEMORY APPARATUS AND RESISTANCE COMPENSATION CIRCUIT THEREOF

CROSS-REFERENCES TO RELATED APPLICATION

This application claims priority under 35 U.S.C. 119(a) to Korean application No. 10-2016-0100600, filed on Aug. 8, 2016, in the Korean intellectual property Office, which is incorporated by reference in its entirety as set forth in full.

BACKGROUND

1. Technical Field

Various embodiments may generally relate to a semiconductor apparatus, and more particularly, to a nonvolatile memory apparatus and a resistance compensation circuit thereof.

2. Related Art

Semiconductor memory apparatuses consist of a plurality of memory cells coupled between a plurality of word lines and a plurality of bit lines.

When an address signal is provided from an external apparatus or a host apparatus, the semiconductor memory apparatus accesses a corresponding memory cell by decoding the address signal through a word line decoder and a bit line decoder.

The word line and the bit line may be, for example, a metal wiring, and a memory cell (remote cell) which is located far away from the word line decoder and the bit line decoder may have a larger resistance than a memory cell (near cell) which is located close to the word line decoder and the bit line decoder.

That is, the resistance of the memory cell is closely related with the word line address and the bit line address.

A write circuit which uses a current source and a read circuit which uses a voltage source may be designed to have large drivability to prevent a write error and a read error due to the large resistance difference between the remote cell and the near cell.

However, as the drivability of the write circuit and the read circuit is increased, the power consumption of the semiconductor memory apparatus is increased.

SUMMARY

According to an embodiment, there is provided a nonvolatile memory apparatus. The nonvolatile memory apparatus may include a memory cell array including a plurality of memory cells coupled between a plurality of word lines and a plurality of bit lines. The nonvolatile memory apparatus may include a resistance compensation circuit configured to generate a compensation resistance value according to a position of a memory cell.

According to an embodiment, there is provided a nonvolatile memory apparatus. The nonvolatile memory apparatus may include a global word line which extends from a row selection circuit and has a shorted portion coupled to a memory cell array. The nonvolatile memory apparatus may include a global bit line which extends from a read/write circuit and has a shorted portion coupled to the memory cell array. The nonvolatile memory apparatus may include a resistance compensation circuit configured to electrically coupled to the shorted portion of the global word line and the shorted portion of the global bit line and generate a compensation resistance value according to a position of a memory cell.

According to an embodiment, there is provided a resistance compensation circuit. The resistance compensation circuit may include a decoding circuit configured to determine a position of a memory cell to be accessed by receiving an address signal. The resistance compensation circuit may include a control signal generation circuit configured to generate a first control signal and a second control signal based on an output signal of the decoding circuit. The resistance compensation circuit may include a switching circuit configured to allow a compensation resistance value to be generated through a resistance providing unit based on the first control signal. The resistance compensation circuit may include a selection circuit configured to provide the compensation resistance value to a wiring of the memory cell to be accessed based on the second control signal.

BRIEF DESCRIPTION OF THE DRAWINGS

FIG. 6 is diagram illustrating a representation of an example of an output signal of a control signal generation circuit according to an embodiment.

FIG. 8 is diagram illustrating a representation of an example of an output signal of a control signal generation circuit according to an embodiment.

DETAILED DESCRIPTION

Figure 1:
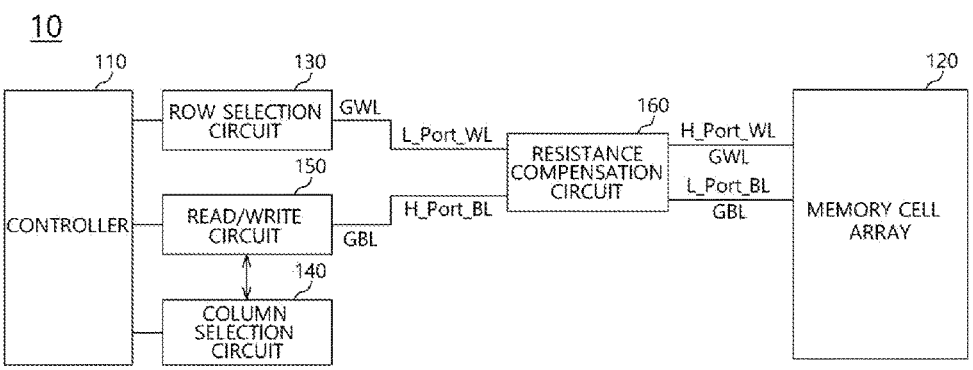
FIG. 1 is a configuration diagram illustrating a representation of an example of a nonvolatile memory apparatus according to an embodiment.

Various embodiments will be described in below with reference to the accompanying drawings which present simplified schematic illustrations of various aspects of the present disclosure. The present disclosure, however, may be embodied in various different forms, and should not be construed as being limited to the illustrated embodiments herein. Rather, these embodiments are provided as examples so that this disclosure will be thorough and complete, and will fully convey the various aspects and features of the present disclosure to those skilled in the art.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present disclosure.

Moreover, it should be understood, that the drawings are simplified illustrations and are not necessarily drawn to scale, nor do they depict details that are not necessary for understanding the present disclosure. As such, variations from the drawings are to be expected including variations as a result, for example, of manufacturing techniques and/or tolerances. Thus, for example, the described embodiments should not be construed as being limited to the particular shapes illustrated herein but may include deviations in shapes that result, for example, from manufacturing. Also, in the drawings, lengths and sizes of layers and regions may be exaggerated for clarity. Like reference numerals in the drawings denote like elements.

It is also to be understood that when a layer is referred to as being "on" another layer or substrate, it can be directly on the other or substrate, or intervening layers may also be present.

It is also noted that in this specification, "connected/coupled" refers to one component not only directly coupling another component but also indirectly coupling another component through an intermediate component. In addition, a singular form may include a plural form, and vice versa as long as it is not specifically mentioned.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

It is also noted, that in some instances, as would be apparent to those skilled in the relevant art, a feature or element described in connection with one embodiment may be used singly or in combination with other features or elements of another embodiment, unless otherwise specifically indicated.

Although a few embodiments of the present disclosure will be illustrated and described, it will be appreciated by those of ordinary skill in the art that changes may be made in these examples of embodiments without departing from the principles and spirit of the present disclosure.

FIG. 1 is a configuration diagram illustrating a representation of an example of a nonvolatile memory apparatus according to an embodiment.

Referring to FIG. 1, a nonvolatile memory apparatus 10 according to an embodiment may include a controller 110, a memory cell array 120, a row selection circuit 130, a column selection circuit 140, a read/write (read and write) circuit 150, and a resistance compensation circuit 160.

The controller 110 may control an overall operation of the nonvolatile memory apparatus 10 to transmit and receive data between a host apparatus (not illustrated) and the nonvolatile memory apparatus 10.

The memory cell array 120 may have a structure whereby the nonvolatile memory cells are coupled in an array form. The memory cell constituting the memory cell array 120 may be configured of, for example, any one among various types of memory cells, such as a flash memory cell, a phase-change random access memory (PRAM) cell using a chalcogenide alloy, a magnetic RAM (MRAM) cell using a tunneling magneto-resistive (TMR) effect, a resistive RAM (RERAM) cell using a transition metal oxide, a polymer RAM cell, a RAM cell using perovskite, and a ferroelectric RAM (FRAM) cell using a ferroelectric capacitor, but the memory cell is not limited thereto. The memory cell array 120 may be implemented with a memory cell in which a level of stored data is determined according to a resistance state of a data storage node.

In an embodiment, the memory cell array 120 may have a two-dimensional (2D) structure that the memory cells are arranged on the same plane or a stacking structure that at least two or more array layers are stacked on the same plane. In another aspect, the memory cell array 120 may have a cross point array structure in which a pair of memory cells are formed in a vertical direction with respect to a plane of a semiconductor substrate so that the pair of memory cells share a preset first signal line and are coupled between a pair of second signal lines in series.

In an embodiment, the memory cell array 120 may have a structure that a plurality of memory cell pairs are included and each of the memory cell pairs shares a bit line and is coupled between a lower word line and an upper word line in series.

Each memory cell constituting the memory cell array 120 may be a single level cell (SLC) which stores 1-bit data in one memory cell or a multi-level cell (MLC) which stores 2-bit or more data in one memory cell.

The row selection circuit 130 and the column selection circuit 140 may be address decoders and may be configured to receive address signals. The row selection circuit 130 and the column selection circuit 140 may decode a row address and a column address of a memory cell to be accessed in the memory cell array 120, that is, a word line address and a bit line address of the memory cell to be accessed through control of the controller 110.

The read/write circuit 150 may be configured to write data in the memory cell array 120 by receiving the data from a data input/output (input and output) (I/O) circuit block (not illustrated) through control of the controller 110 or provide data read out from a selected memory cell of the memory cell array 120 to the data I/O circuit block through control of the controller 110.

The resistance compensation circuit 160 may be configured to compensate resistance components for memory cells coupled to the word lines and the bit lines based on the address signal.

The word lines and the bit lines to which the memory cells are coupled may be, for example, a metal wiring. When the physical position relation of the nonvolatile memory apparatus 10 is considered, on the basis of the row selection circuit 130 and the read/write circuit 150, the memory cell remotely located may have a larger resistance than the memory cell nearly located.

However, it may be impossible to physically reduce the resistances of the memory cells having the high resistance. Accordingly, the resistance compensation circuit 160 may generate a compensation resistance value in inverse proportion to a distance of the memory cell to the row selection circuit 130 and the read/write circuit 150. The resistance compensation circuit 160 may be configured to provide the compensation resistance value so that the memory cells have the same wiring resistance.

In an embodiment, on the basis of a resistance value of the memory cell most remotely located from the row selection circuit 130 and the read/write circuit 150, the resistance compensation circuit 160 may generate the resistance value for compensating a resistance difference according to a position of the memory cell based on the address signal.

In an embodiment, the resistance compensation circuit 160 may divide the memory cell array 120 into a plurality of regions in a word line direction and a bit line direction. The resistance compensation circuit 160 may generate the compensation resistance value for each region on the basis of a resistance value of a region which is most remotely located from the row section circuit 130 or the read/write circuit 150.

An example that the memory cell array 120 is divided into 8 regions in the word line direction will be described. For example, when the resistance value of the region which is most remotely located from the row selection circuit 130 is "A", the resistance values of the regions in the memory cell array 120 may be (1/8)A, (2/8)A, (3/8)A, (4/8)A, (5/8)A, (6/8)A, (7/8)A, and (8/8)A in close order to the row selection circuit 130.

Accordingly, the resistance compensation circuit 160 may generate the compensation resistance values of (7/8)A, (6/8)A, (5/8)A, (4/8)A, (3/8)A, (2/8)A, (1/8)A, 0 A according to the regions and provide the generate compensation resistance values to the regions.

Similarly, the resistance compensation circuit 160 may divide the memory cell region 120 into a plurality of regions in the bit line direction and provide the compensation resistance values to the regions.

Accordingly, the memory cells constituting the memory cell array 120 may substantially have the same wiring resistance or may have similar wiring resistances regardless of the positions thereof.

In an embodiment, the resistance compensation circuit 160 may be configured to further provide a compensation resistance value of a word line side between a global word line GWL extending from the row selection circuit 130 and the memory cell array 120. For example, the resistance compensation circuit 160 may be configured that one port L_Port_WL among output ports may be coupled to the global word line GWL of a row selection circuit 130 side and the other port H_Port_WL may be coupled to the global word line GWL of a memory cell array 120 side.

The resistance compensation circuit 160 may be configured to further provide a compensation resistance value of a bit line side between the global bit line GBL extending from the read/write circuit 150 and the memory cell array 120. For example, the resistance compensation circuit 160 may be configured that one port H_Port_BL among output ports may be coupled to a global bit line GBL of a read/write circuit 150 side and the other port L_Port_BL may be coupled to the global bit line GBL of the memory cell array 120 side.

Figure 2:
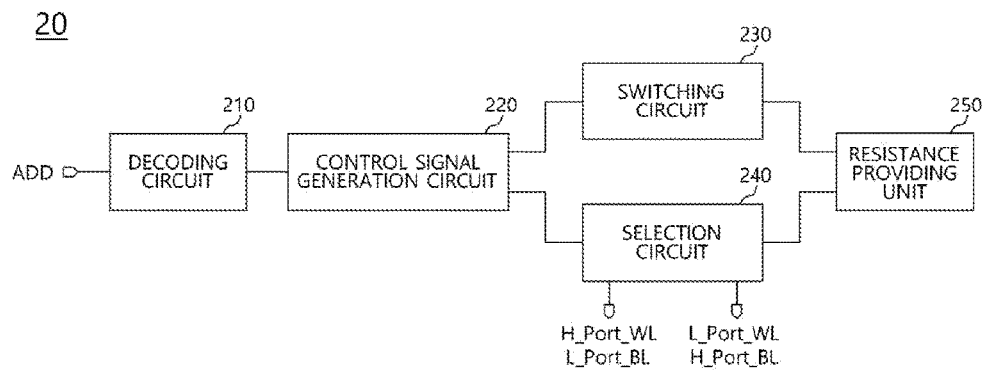
FIG. 2 is a configuration diagram illustrating a representation of an example of a resistance compensation circuit according to an embodiment.

FIG. 2 is a configuration diagram illustrating a representation of an example of a resistance compensation circuit according to an embodiment.

Referring to FIG. 2, a resistance compensation circuit 20 according to an embodiment may include a decoding circuit 210, a control signal generation circuit 220, a switching circuit 230, a selection circuit 240, and a resistance providing unit 250.

The decoding circuit 210 may determine a position (region) of the memory cell array 120 accessed in a write or read operation in response to an address signal ADD. For example, the memory cell array 120 may be divided into the plurality of regions in the word line direction and the bit line direction.

In an embodiment, the decoding circuit 210 may determine the region of the accessed memory cell array 120 based on an upper N-bit signal of the address signal ADD. The number of upper bits of the address signal which are used to determine the region may be determined according to the number of divided regions of the memory cells 120.

The control signal generation circuit 220 may be configured to generate a first control signal of plural bits for determining a compensation resistance value and a second control signal of plural bits for applying the compensation resistance value to the memory cell array 120 in response to an output signal of the decoding circuit 210. The first control signal may be a switching signal and the second control signal may be a selection signal.

The resistance providing unit 250 may be configured to include a plurality of wirings. In an embodiment, the resistance providing unit 250 may be a plurality of dummy cell lines which may be provided in the memory cell array 120.

In general, when a resistor is formed using a material different from a material for the word line/bit line, for example, a material for a resistor, a polysilicon layer, and the like on a silicon substrate, a resultant resistance value of the bit line/the word line may be changed according to process dispersion and process change. Accordingly, when the resistance providing unit 250 is configured using a dummy cell line fabricated through the same process as the word line/bit line process, the resistance compensation circuit 20 may provide the same resistance value as the resistance vale of the word line/bit line. An area occupied with the resistance compensation circuit 20 may be minimized using the dummy cell line fabricated through the word line/bit line process without an additional passive element.

The switching circuit 230 may be coupled between the plurality of wirings constituting the resistance providing unit 250. The switching circuit 230 may be configured to determine a serial or parallel connection relation of the plurality of wirings constituting the resistance providing unit 250 in response to the first control signal and allow the compensation resistance value to be generated according to the connection relation.

The selection circuit 240 may be configured to apply the compensation resistance value generated through the resistance providing unit 250 and the switching circuit 230 to the word line and the bit line in response to the second control signal. In another aspect, the selection circuit 240 may be configured to allow the resistance providing unit 250 to be intervened in the word line and the bit line in response to the second control signal.

In an embodiment, the global word line may be configured that a portion of the global word line may be electrically shorted to apply the compensation resistance value to the word line. The global word line may be configured that the one port L_Port_WL and the other port H_Port_WL as the output ports of the selection circuit 240 may be electrically coupled to the shorted portion of the global word line.

In an embodiment, the global bit line may be configured that a portion of the global bit line may be electrically shorted to apply the compensation resistance value to the bit line. The global bit line may be configured that the one port H_Port_BL and the other port L_Port_BL as the output ports of the selection circuit 240 may be electrically coupled to the shorted portion of the global word line.

When a specific memory cell is accessed, the compensation resistance value determined through the resistance compensation circuit 20 may be reflected to the word line and the bit line of the corresponding memory cell, and thus the remote cell and the near cell may substantially have the same wiring resistance as each other or may have similar wiring resistances to each other.

Figure 3:
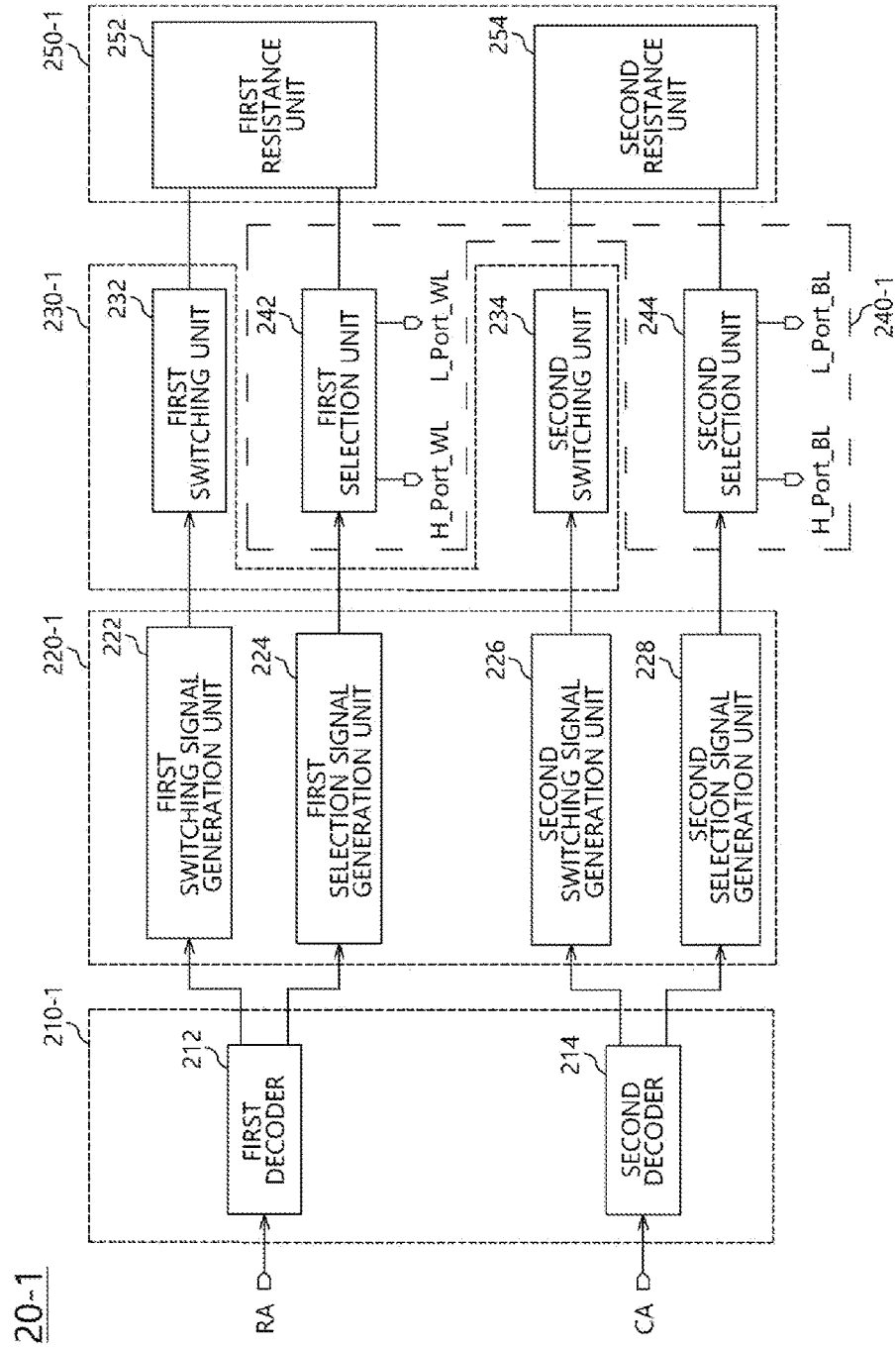
FIG. 3 is a configuration diagram illustrating a representation of an example of a resistance compensation circuit according to an embodiment.

FIG. 3 is a configuration diagram illustrating a representation of an example of a resistance compensation circuit according to an embodiment.

Referring to FIG. 3, a resistance compensation circuit 20-1 may include a decoding circuit 210-1, a control signal generation circuit 220-1, a switching circuit 230-1, a selection circuit 240-1, and a resistance providing unit 250-1.

The decoding circuit 210-1 may include a first decoder 212 and a second decoder 214.

The first decoder 212 may determine a row direction position (region) of the memory cell array 120 accessed in the write or read operation in response to a row address RA. The second decoder 214 may determine a column direction position (region) of the memory cell array 120 accessed in the write or read operation in response to a column address CA.

The memory cell array 120 may be divided into the plurality of regions in the word line direction and the bit line direction.

The control signal generation circuit 220-1 may include a first switching signal generation unit 222, a first selection signal generation unit 224, a second switching signal generation unit 226, and a second selection signal generation unit 228.

The first switching signal generation unit 222 may be configured to generate a first switching signal of plural bits for determining the compensation resistance value for the word line in response to an output signal of the first decoder 212.

The first selection signal generation unit 224 may be configured to generate a first selection signal of plural bits for applying the compensation resistance value to the word line in response to the output signal of the first decoder 212.

The second switching signal generation unit 226 may be configured to generate a second switching signal of plurality bits for determining the compensation resistance value for the bit line in response to an output signal of the second decoder 214.

The second selection signal generation unit 228 may be configured to generate a second selection signal of plural bits for applying the compensation resistance value to the bit line in response to the output signal of the second decoder 214.

The switching circuit 230-1 may be configured to include a first switching unit 232 and the second switching unit 234. The selection circuit 240-1 may be configured to include a first selection unit 242 and a second selection unit 244. The resistance providing unit 250-1 may be configured to include a first resistance unit 252 and a second resistance unit 254.

The first switching unit 232 may be coupled between a plurality of wirings constituting the first resistance unit 252. The first switching unit 232 may be configured to determine a serial or parallel connection relation for the plurality of wirings constituting the first resistance unit 252 in response to the first switching signal and allow the compensation resistance value of the word line side to be generated according to the connection relation.

The second switching unit 234 may be coupled between a plurality of wirings constituting the second resistance unit 254. The second switching unit 234 may be configured to determine a serial or parallel connection relation for the plurality of wirings constituting the second resistance unit 254 in response to the second switching signal and allow the compensation resistance value of the bit line side to be generated according to the connection relation.

The first selection unit 242 may be configured to apply the compensation resistance value of the word line side generated through the first resistance unit 252 and the first switching unit 232 to the word line in response to the first selection signal. In an embodiment, the first selection unit 242 may be configured such that the global word line GWL may extend via the one port H_Port_WL and the other port L_Port_WL as output ports of the first selection unit 242 to further provide the compensation resistance value of the word line side between the global word line GWL and the memory cell array 120.

The second selection unit 244 may be configured to apply the compensation resistance value of the bit line side generated through the second resistance unit 254 and the second switching unit 234 to the bit line in response to the second selection signal. In an embodiment, the second selection unit 244 may be configured that the global bit line GBL may extend via the one port H_Port_BL and the other port L_Port_BL as output ports of the second selection unit 244 to further provide the compensation resistance value of the bit line side between the global bit line GBL and the memory cell array 120.

Each of the first resistance unit 252 and the second resistance unit 254 may include the plurality of wirings and the resistance values of the first resistance unit 252 and the second resistance unit 254 may be determined as the compensation resistance value of the word line side and the compensation resistance value of the bit line side through the first switching unit 232 and the second switching unit 234. The compensation resistance values may be further provided to the word line and the bit line through the first selection unit 242 and the second selection unit 244, and thus the memory cells may substantially have the same wiring resistance or may have similar wiring resistances regardless of the positions of the memory cells.

Figure 4:
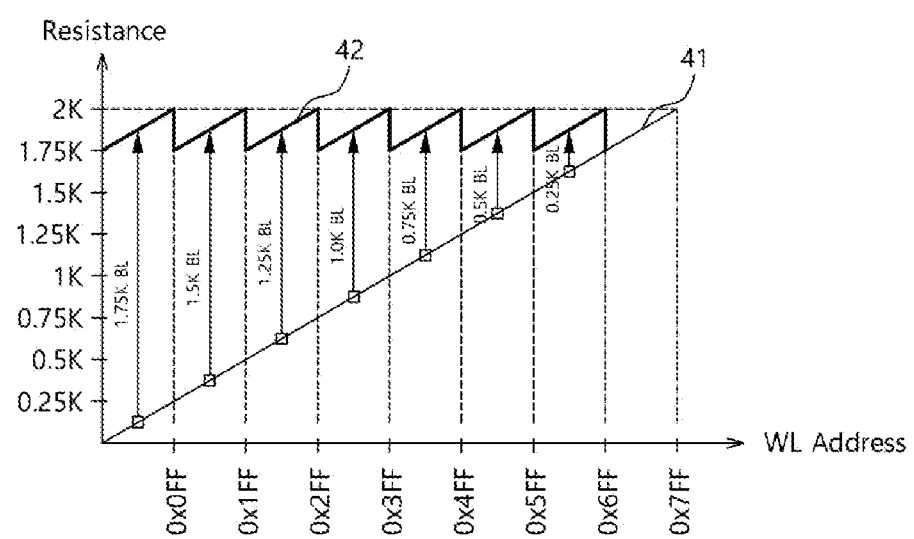
FIG. 4 is a diagram explaining a resistance difference according to a region of a memory cell array according to an embodiment.

FIG. 4 is a diagram explaining a resistance difference according to a region of a memory cell array according to an embodiment.

An example that the memory cell array 120 is divided into eight regions in a word line direction is illustrated in FIG. 4.

When the nonvolatile memory apparatus may not include the resistance compensation circuit 160 and 20, a wiring resistance of a memory cell is increased in proportion to a word line address as indicated by 41.

When it is assumed that the wiring resistance of the memory cell which is most remotely located from the row selection circuit 130 is 2K, the wiring resistance according to the word line address for the region may be listed in the following Table 1.

TABLE 1

| Region | WL address | Resistance |
|---|---|---|
| 1 | 0x0~0x0FF | 0.25K |
| 2 | 0x100~0x1FF | 0.5K |
| 3 | 0x200~0x2FF | 0.75K |
| 4 | 0x300~0x3FF | 1K |
| 5 | 0x400~0x4FF | 1.25K |

TABLE 1-continued

| Region | WL address | Resistance |
|---|---|---|
| 6 | 0x500~0x5FF | 1.5K |
| 7 | 0x600~0x6FF | 1.75K |
| 8 | 0x700~0x7FF | 2K |

That is, the wiring resistances of memory cells located in a region 1 may be necessarily compensated by 1.75K as compared with the wiring resistances of the memory cells located in a region 8. Similarly, the wiring resistances of memory cells located in a region 2 may be necessarily compensated by 1.5K as compared with the wiring resistances of the memory cells located in the region 8.

For example, the decoding circuit 210 and 210-1 according to an embodiment may generate a region determination signal by determining a region of a memory cell to be accessed in response to the row address RA and the column address CA.

The control signal generation circuit 220 and 220-1 may generate the first control signal configured of plural bits A1 to A8 and the second control signal configured of plural bits S1 to S6 in response to the region determination signal.

As the wiring resistance is compensated according to the region, the memory cells in all the regions divided in the word line direction may substantially have the same wiring resistance or may have similar wiring resistances as indicated by 42.

Figure 5A:
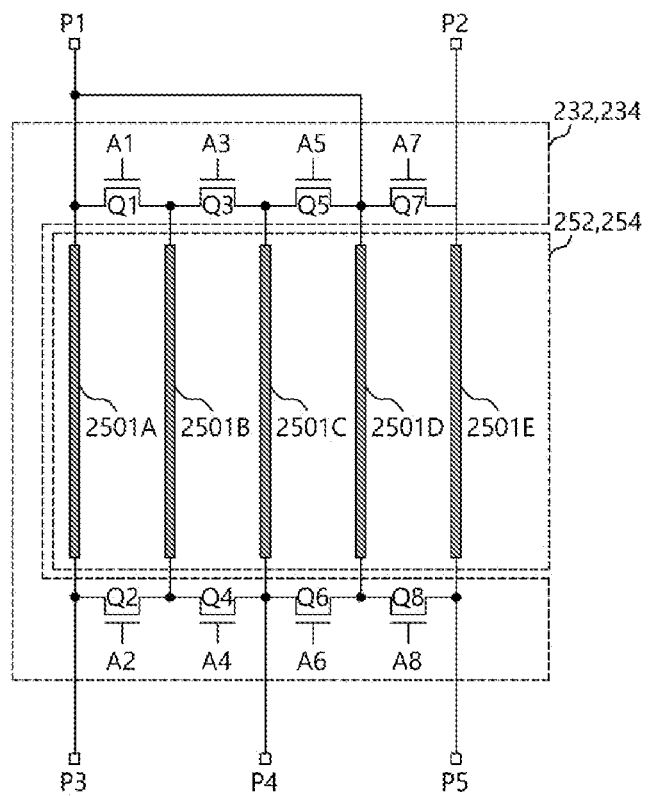
FIG. 5A is a diagram illustrating a representation of an example of a configuration of a switching circuit, a selection circuit, and a resistance providing unit according to an embodiment.

FIG. 5A is a diagram illustrating a representation of an example of a configuration of a switching circuit, a selection circuit, and a resistance providing unit according to an embodiment and FIG. 6 diagram illustrating an output signal of a control signal generation circuit according to an embodiment.

Referring to FIG. 5A, each of the first resistance unit 252 and the second resistance unit 254 constituting the resistance providing unit 250 and 250-1 may include a plurality of wirings 2501A, 2501B, 2501C, 2501D, and 2501E. As described above, the plurality of wirings 2501A to 2501E may be dummy cell lines simultaneously fabricated in a fabrication process of the memory cell array 120, but this is not limited thereto.

Each of the first switching unit 232 and the second switching unit 234 constituting the switching circuit 230 and 230-1 may include a plurality of switching elements Q1 to Q8 configured to electrically couple the plurality of wirings 2501A to 2501E and to be driven in response to the first control signal A1 to A8. In an embodiment, each of the plurality of switching elements Q1 to Q8 may be a MOS transistor.

In an embodiment, the plurality of wirings 2501A to 2501E may include a plurality of output ports P1 to P5 in preset positions.

The output ports P1 to P5 of each of the first resistance unit 252 and the second resistance unit 254 may be electrically coupled to input terminals of each of the first selection unit 242 and the second selection unit 244 constituting the selection circuit 240 and 240-1. Each of the first selection unit 242 and the second selection unit 244 may include a plurality of switching elements M1 to M6 configured to couple two ports selected among the plurality of output ports P1 to P5 to a first port H_Port and a second port L_Port of the selection circuit 240 and 240-1 in response to the second control signal S1 to S6.

Referring to FIG. 6, the first control signal A1 to A8 and the second control signal S1 to S6 may be generated in response to the region determination signal generated according to an address of the memory cell to be accessed. The compensation resistance value may be determined through first control signal A1 to A8 and the switching circuit 230 and 230-1. The compensation resistance value may be applied to the word line and the bit line through the second control signal S1 to S6 and the selection circuit 240 and 240-1.

Figure 5A:
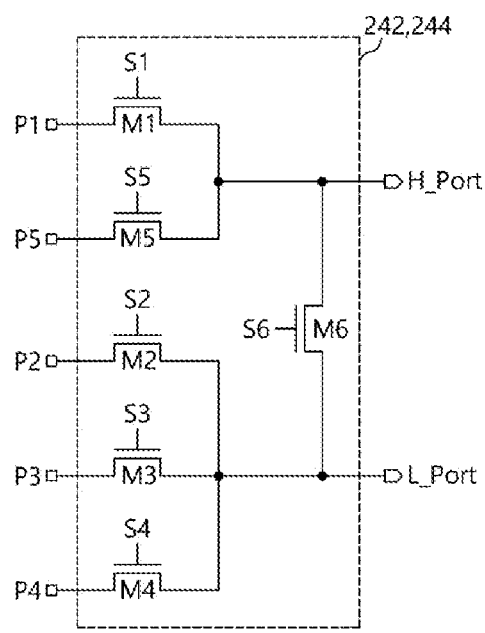
Figure 5B:
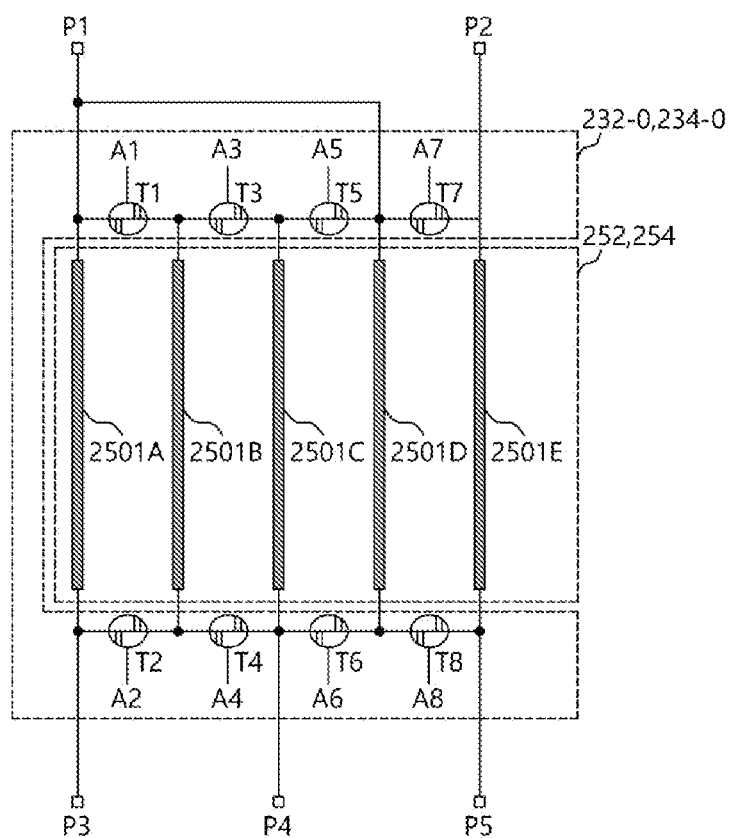
FIG. 5B is a diagram illustrating a representation of an example of a configuration of a switching circuit and a resistance providing unit according to an embodiment.

FIG. 5B is a diagram illustrating a representation of an example of a configuration of a switching circuit and a resistance providing unit according to an embodiment.

Referring to FIG. 5B, each of the first switching unit 232-0 and the second switching unit 234-0 constituting the switching circuit 230 and 230-1 may include a plurality of switching elements T1 to T8 configured to electrically couple the plurality of wirings 2501A to 2501E and to be driven in response to the first control signal A1 to A8. In an embodiment, each of the plurality of switching elements T1 to T8 may be an ovonic threshold switching (OTS) element.

The three-terminal OTS element may include a first terminal, a second terminal, and a control terminal. In an embodiment, the first terminal and the second terminal of each of the plurality of switching elements T1 to T8 using the three-terminal OTS element may be coupled between the plurality of wirings 2501A to 2501E and the control terminal thereof may receive the first control signal A1 to A8.

Since the OTS element has a very small resistance, the resistance distribution when each of the switching elements T1 to T8 is turned on may be maintained to a very small value. Since the off current of the OTS element is also very small, the target resistance value may be very accurately realized.

The region division of the memory cell array 120, the generation of the first and second control signals A1 to A8 and S1 to S6, the configuration of the resistance providing unit 250 and 250-1, the configuration of the switching circuit 230 and 230-1, and the configuration of the selection circuit 240 and 240-1 illustrated in FIGS. 4 to 6 may be merely examples, and any configuration which generates the compensation resistance value according to the position of the memory cell based on the address signal and provide the generated compensated resistance value may be employed.

Figure 7A:
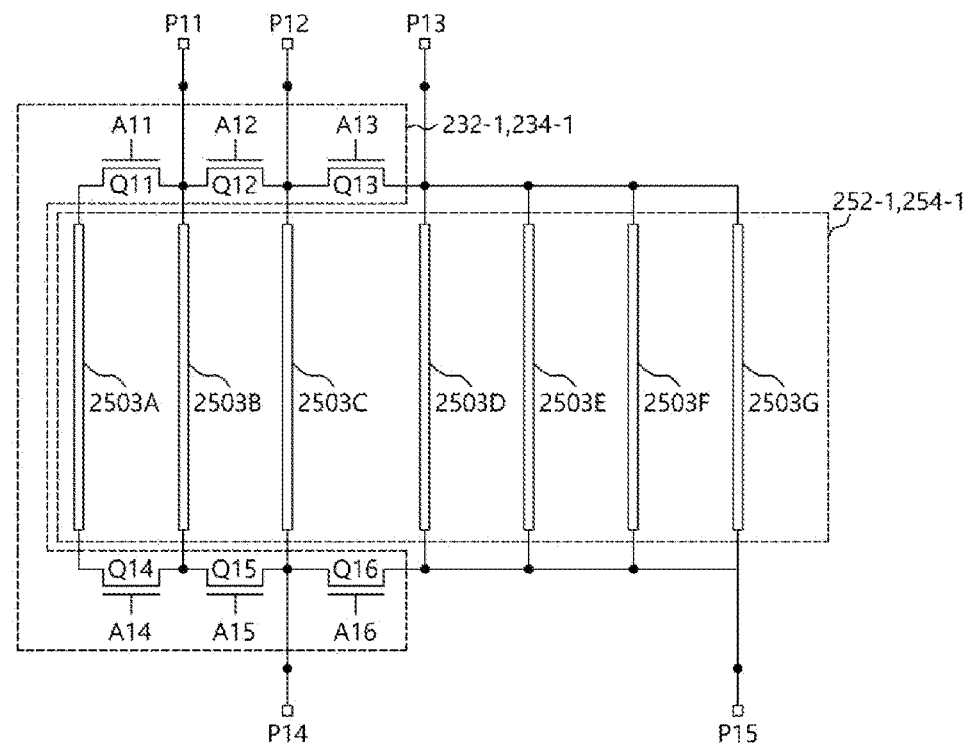
FIG. 7A is a diagram illustrating a representation of an example of a configuration of a switching circuit, a selection circuit, and a resistance providing unit according to an embodiment.
Figure 7A:
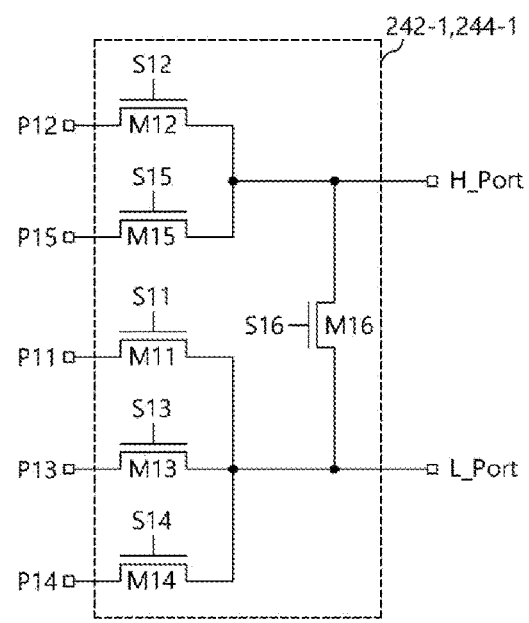

FIG. 7A is a diagram illustrating a representation of an example of a configuration of a switching circuit, a selection circuit, and a resistance providing unit according to an embodiment and FIG. 8 is diagram illustrating a representation of an example of output signals of a decoding circuit and a control signal generation circuit according to an embodiment.

Referring to FIG. 7A, each of the first resistance unit 252-1 and the second resistance unit 254-1 constituting the resistance providing unit 250 and 250-1 may include a plurality of wirings 2503A, 2503B, 2503C, 2503D, 2503E, 2503F, and 2503G. As described above, the plurality of wirings 2503A to 2503G may be dummy cell lines simultaneously fabricated in a fabrication process of the memory cell array 120.

Each of the first switching unit 232-1 and the second switching unit 234-1 constituting the switching circuit 230 and 230-1 may include a plurality of switching elements Q11 to Q16 configured to electrically couple the plurality of wirings 2503A to 2503G and to be driven in response to a first control signal of plural bits A11 to A16.

In an embodiment, the plurality of wirings 2503A to 2503G may include a plurality of output ports P11 to P15 in preset positions.

The output ports P11 to P15 of each of the first resistance unit 252-1 and the second resistance unit 254-1 may be electrically coupled to input terminals of each of the first selection unit 242-1 and the second selection unit 244-1 constituting the selection circuit 240 and 240-1. Each of the first selection unit 242-1 and the second selection unit 244-1 may include a plurality of switching elements M11 to M16 configured to couple two ports selected among the plurality of output ports P11 to P15 to the first port H_Port and the second port L_Port of the selection circuit 240 and 240-1 in response to a second control signal of plural bits S11 to S16.

Referring to FIG. 8, the first control signal A11 to A16 and the second control signal S11 to S16 may be generated in response to the region determination signal generated according to an address of the memory cell to be accessed. The compensation resistance value may be determined through the first control signal A11 to A16 and the switching circuit 230 and 230-1. The compensation resistance value may be applied to the word line and the bit line through the second control signal S11 to S16 and the selection circuit 240 and 240-1.

Figure 7B:
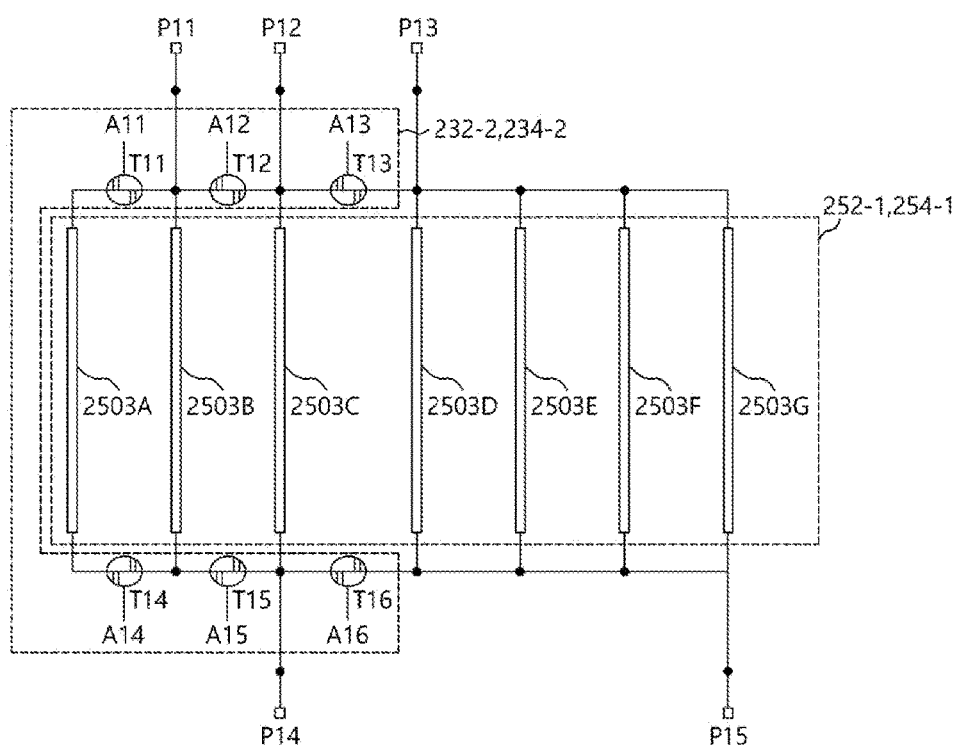
FIG. 7B is a diagram illustrating a representation of an example of a configuration of a switching circuit and a resistance providing unit according to an embodiment.

FIG. 7B is a diagram illustrating a representation of an example of a configuration of a switching circuit and a resistance providing unit according to an embodiment.

Referring to FIG. 7B, each of the first switching unit 232-2 and the second switching unit 234-2 constituting the switching circuit 230 and 230-1 may include a plurality of switching elements T11 to T16 configured to electrically couple the plurality of wirings 2503A to 2503G and to be driven in response to the first control signal A11 to A16. In an embodiment, each of the plurality of switching elements T11 to T16 may be an ovonic threshold switching (OTS) element.

In an embodiment, the first terminal and the second terminal of each of the plurality of switching elements T11 to T16 using the three-terminal OTS element may be coupled between the preset number of wirings 2503A, 2503B, 2503C, and 2503D among the plurality of wirings 2503A to 2503G and the control terminal may receive the first control signal A11 to A16.

Figure 9:
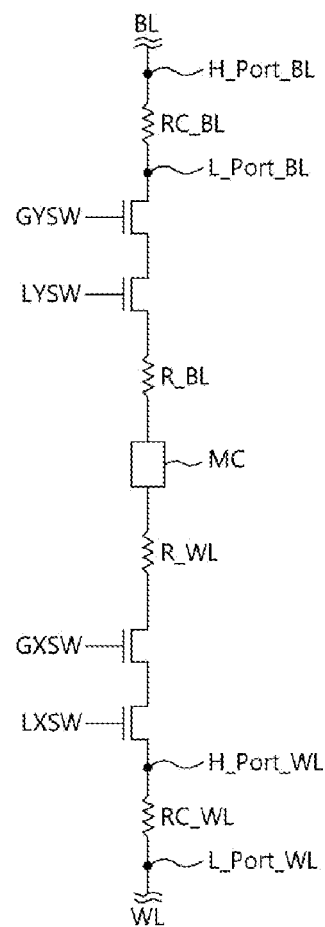
FIG. 9 is a circuit diagram explaining a resistance compensation concept according to an embodiment.

FIG. 9 is a circuit diagram explaining a resistance compensation concept according to an embodiment.

In general, a wiring resistance of a memory cell MC coupled between a bit line BL and a word line WL may be determined as a bit line resistor R_BL and a word line resistor R_WL.

In the technology, a compensation resistor RC_BL of a bit line side and a compensation resistor RC_WL of a word line side may be further intervened.

The compensation resistor RC_BL of the bit line side and the compensation resistor RC_WL of the word line side may be resistors generated in the resistance compensation circuit 160 and 20 based on the address signal, that is, the position of the memory cell MC.

In an embodiment, the compensation resistor RC_BL of the bit line side may be interposed between the first port H_Port_BL and the second port L_Port_BL as the output ports of the second selection unit 244 and 244-1 illustrated in FIG. 5A or 7A.

In an embodiment, the compensation resistance RC_WL of the word line side may be interposed between the first port H_Port_WL and the second port L_Port_WL as the output ports of the first selection unit 242 and 242-1 illustrated in FIG. 5A or 7A.

The nonvolatile memory apparatus 10 according to the technology may substantially have the same wiring resistance or may have similar wiring resistances regardless of the positions of the memory cells.

In embodiment, the GYSW may be a global bit line switching signal, the LYSW may be a local bit line switching signal, the GXSW may be a global word line switching signal, and the LXSW may be a local word line switching signal.

Figure 10:
FIGS. 10 to 12 are diagrams illustrating representations of examples of configurations of a memory cell according to embodiments.
Figure 11:
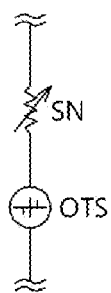
Figure 12:
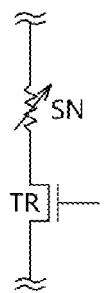

FIGS. 10 to 12 are diagrams illustrating representations of examples of configurations of a memory cell according to embodiments.

FIG. 10 illustrates an example of a memory cell MC-1 whereby a storage node SN and an access element D are coupled in series.

The storage node SN may be configured using a material of which a resistance value is changed according to an applied current amount. The access element D may be, for example, a diode.

FIG. 11 illustrates an example of a memory cell MC-2 whereby a storage node SN and an access element OTS are coupled in series. In an embodiment, the access element OTS may be an OTS switching element.

FIG. 12 illustrates an example of a memory cell MC-3 whereby a storage node SN and an access element TR are coupled in series. In an embodiment, the access element TR may be a MOS transistor, for example, a vertical channel transistor.

Figure 13:
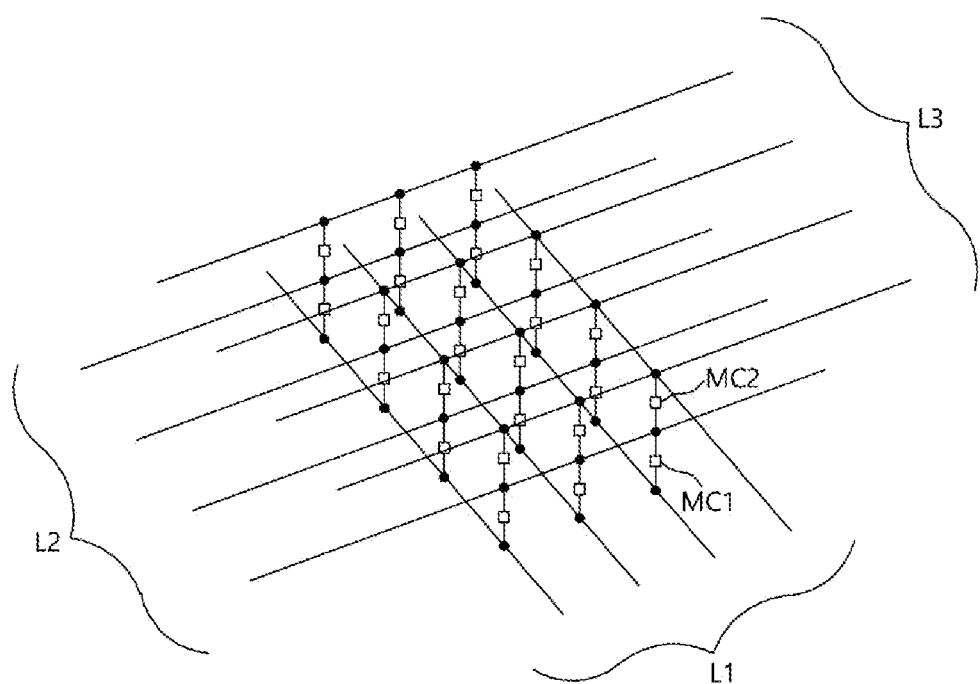
FIG. 13 is a diagram illustrating a representation of an example of a configuration of a memory cell array according to an embodiment.

FIG. 13 is a diagram illustrating a representation of an example of a configuration of a memory cell array according to an embodiment.

A memory cell array 120-1 illustrated in FIG. 13 may have a cross point array structure.

For example, a first memory cell MC1 may be arranged between a first wiring L1 and a second wiring L2 and a second memory cell MC2 may be arranged between the second wiring L2 and a third wiring L3.

The second wiring L2 may be arranged in an upper side in a vertical direction rather than the first wiring L1 with respect to a plane of a substrate (not illustrated). The third wiring L3 may be arranged in an upper side in the vertical direction rather than the second wiring L2 with respect to the plane of the substrate.

The resistance difference according to a distance of a memory cell to the row selection circuit and the column selection circuit may be further intensified in the cross point array structure. However, all the memory cells may substantially have the same wiring resistance or may have similar wiring resistances by employing the resistance compensation circuit 160 and 20, and thus a read margin and a write margin may be guaranteed.

FIGS. 14 to 18 are configuration diagrams illustrating examples of a representation of an electronic apparatus according to various embodiments of the present technical spirit.

Figure 14:
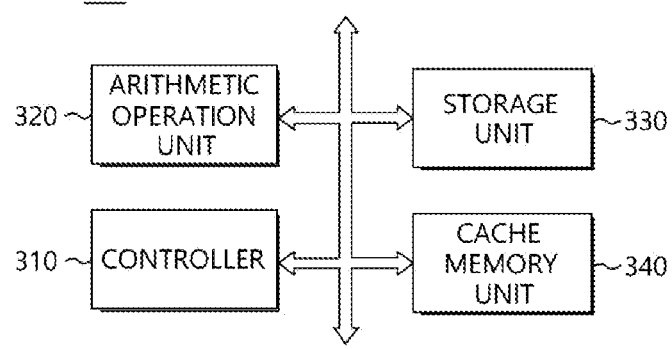
FIGS. 14 to 18 are configuration diagrams illustrating examples of a representation of an electronic apparatus according to various embodiments.

FIG. 14 is a configuration diagram illustrating an example of a representation of a processor as an electronic apparatus according to an embodiment of the present technical spirit.

Referring to FIG. 14, a processor 30 may include a controller 310, an arithmetic operation unit 320, a storage unit 330, and a cache memory unit 340.

The controller 310 may control an overall operation of the processor 30 such as operations of decoding a command, performing input, output, or processing on data, and the like by receiving a signal such as the command or data from an external apparatus.

The arithmetic operation unit 320 may perform several arithmetic operations according to a decoding result of the command in the controller 310. The arithmetic operation unit 320 may include at least one arithmetic and logic unit (ALU), but this is not limited thereto.

The storage unit 330 may serve as a register, and may be configured to store data in the processor 30. The storage unit 330 may include a data register, an address register, a floating-point register, and other various registers. The storage unit 330 may store addresses in which data operated in the arithmetic operation unit 320, data according to an operation result, and data to be processed in the arithmetic operation unit 320 are stored.

The storage unit 330 may be formed of a nonvolatile memory apparatus, and for example, the storage unit 330 may include the resistance compensation circuit 160 and 20 as illustrated in FIGS. 1 and 2. Accordingly, the resistance compensation circuit 160 may compensate a wiring resistance of a memory cell to be accessed based on an address signal of the memory cell to be accessed.

The cache memory unit 340 may serve as a temporary storage space.

The processor 30 illustrated in FIG. 14 may be a central processing unit (CPU) of an electronic apparatus, a graphic processing unit (GPU), a digital signal processor (DSP), an application processor (AP), and the like.

Figure 15:
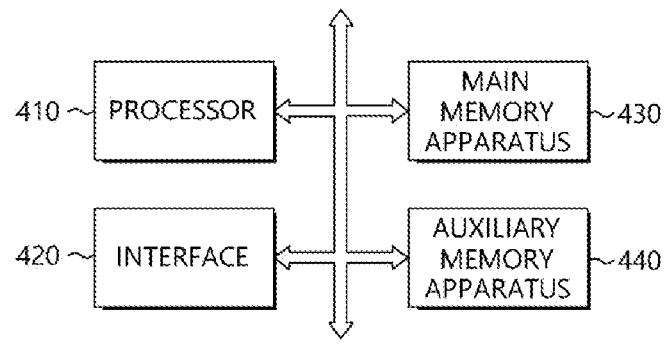
Figure 16:
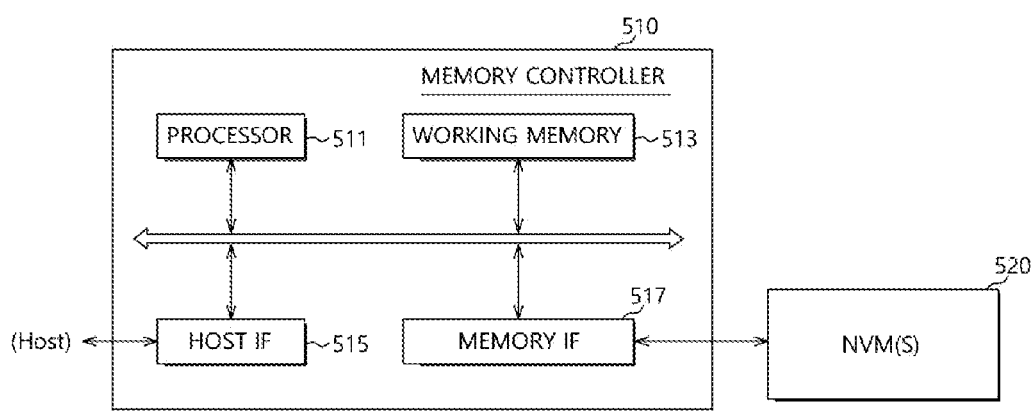

FIGS. 15 and 16 are configuration diagrams illustrating examples of a representation of a data processing system as an electronic apparatus according to various embodiments of the present technical spirit.

A data processing system 40 illustrated in FIG. 15 may include a processor 410, an interface 420, a main memory apparatus 430, and an auxiliary memory apparatus 440.

The data processing system 40 may perform input, processing, output, communication, storage, and the like to perform a series of operations for data processing, and may be an electronic apparatus such as a computer server, a personal portable terminal, a portable computer, a web tablet computer, a wireless terminal, a mobile communication terminal, a digital content player, a camera, a satellite navigation system, a video camera, a tape recorder, a telematics device, an audio/video (AV) system, or a smart television (TV).

In an embodiment, the data processing system 40 may be a data storage apparatus. The data processing system 40 may be a disc type apparatus such as a hard disc, an optical drive, a solid state disc, or a digital versatile disc (DVD) or a card type apparatus such as a universal serial bus (USB) memory, a secure digital (SD) card, a memory stick, a smart media card, internal/external multimedia cards, or a compact flash card.

The processor 410 may exchange data between the main memory apparatus 430 and an external apparatus through the interface 420, and the processor 410 may perform an overall operation such as decoding of commands input from the external apparatus through the interface 420 and an operation or comparison of data stored in the system.

The interface 420 may provide an environment that a command and data are exchangeable between the external apparatus and the data processing system 40. The interface 420 may be a man-machine interface apparatus which includes an input apparatus (for example, a keyboard, a keypad, a mouse, a voice recognition apparatus, and the like) and an output apparatus (for example, a display, speaker, and the like) or a card interface apparatus or a disc interface apparatus (for example, Integrated Drive Electronics (IDE), Small Computer System Interface (SCSI), Serial Advanced Technology Attachment (SATA), External SATA (eSATA), Personal Computer Memory Card International Association (PCMCIA), and the like) according to an application environment of the data processing system 40.

The main memory apparatus 430 may store an application, a control signal, data, and the like required for an operation of the data processing system 40, and may serve as a storage space which may transfer and execute program or data from the auxiliary storage apparatus 440. The main memory apparatus 430 may be implemented using a nonvolatile memory apparatus.

The auxiliary memory apparatus 440 may be a space for storage of a program code, data, and the like, and may be a high-capacity memory apparatus. For example, the auxiliary memory apparatus 440 may be implemented using the nonvolatile memory apparatus 10 illustrated in FIG. 1.

The main memory apparatus 430 and the auxiliary memory apparatus 440 may employ the nonvolatile memory apparatus 10 illustrated in FIG. 1 and may include the resistance compensation circuit 160 and 20. The resistance compensation circuit 160 and 20 may compensate a wiring resistance of a memory cell to be accessed based on the address signal of the memory cell.

A data processing system 50 illustrated in FIG. 16 may include a memory controller 510 and a nonvolatile memory apparatus 520.

The memory controller 510 may be configured to access the nonvolatile memory apparatus 520 in response to a request from a host. The memory controller 510 may include a processor 511, a working memory 513, a host interface (IF) 515, and a memory interface (IF) 517.

The process 511 may be configured to control an overall operation of the memory controller 510. The working memory 513 may store an application, data, a control signal, and the like required for the operation of the memory controller 510.

The host interface 515 may perform protocol conversion for exchange of data and a control signal between the host and the memory controller 510, and the memory interface 517 may perform protocol conversion for exchange of data and a control signal between the memory controller 510 and the nonvolatile memory apparatus 520.

In an embodiment, the nonvolatile memory apparatus 520 and/or the working memory 513 may employ the nonvolatile memory apparatus 10 illustrated in FIG. 1 and may include the resistance compensation circuit 160 and 20. Accordingly, the resistance compensation circuit 160 and 20 may compensate a wiring resistance of a memory cell to be accessed based on an address signal of the memory cell.

The data processing system 50 illustrated in FIG. 16 may be used as a disc apparatus or internal/external memory cards of a portable electronic apparatus. The data processing system 50 may be used as an image processor and other application chipsets.

Figure 17:
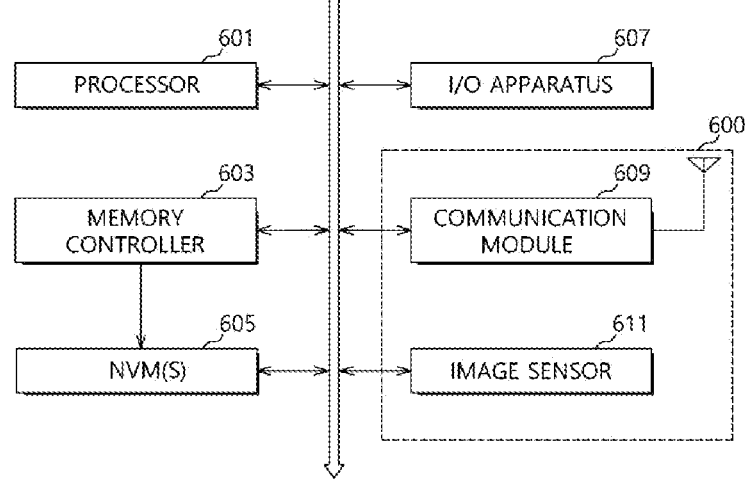
Figure 18:
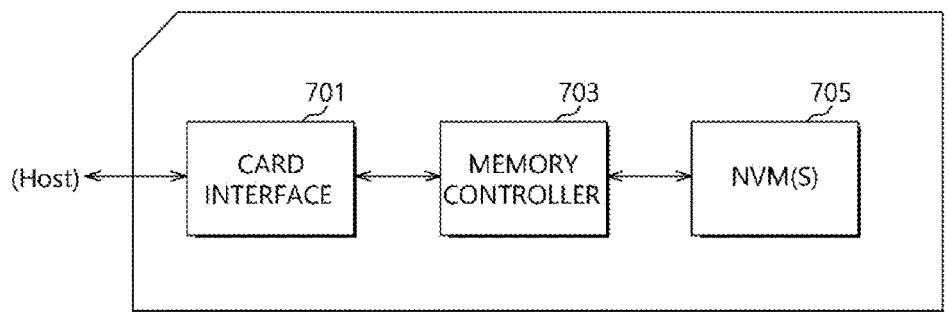

FIGS. 17 and 18 are configuration diagrams illustrating other examples of a representation of an electronic apparatus according to various embodiments of the present technical spirit.

An electronic apparatus 60 illustrated in FIG. 17 may include a processor 601, a memory controller 603, a nonvolatile memory apparatus 605, an input/output (I/O) apparatus 607, and a function module 600.

The memory controller 603 may control a data processing operation, for example, a write operation, a read operation, and the like of the nonvolatile memory apparatus 605 according to control of the processor 601.

Data programmed in the nonvolatile memory apparatus 605 may be output through the I/O apparatus 607 according to control of the processor 601 and the memory controller 603. For example, the I/O apparatus 607 may include a display apparatus, a speaker apparatus, and the like.

In an embodiment, the nonvolatile memory apparatus 605 may employ the nonvolatile memory apparatus 10 illustrated in FIG. 1 and may include the resistance compensation circuit 160 and 20. Accordingly, the resistance compensation circuit 160 and 20 may compensate a wiring resistance of a memory cell to be accessed based on an address signal of the memory cell.

The I/O apparatus 607 may also include an input apparatus, and the I/O apparatus 607 may input a control signal for controlling an operation of the processor 601 or data to be processed in the processor 601 through the input apparatus.

In an embodiment, the memory controller 603 may be implemented with a portion of the processor 601 or a separate chipset from the processor 601.

The function module 600 may be a module which may perform a function selected according to an application example of the electronic apparatus 60 illustrated in FIG. 17, and a communication module 609 and an image sensor 611 as an example of the function module 600 are illustrated in FIG. 17.

The communication module 609 may provide a communication environment that the electronic apparatus 60 is coupled to a wired or wireless communication network to exchange data and a control signal.

The image sensor 611 may convert an optical image to digital image signals and transfer the digital image signals to the processor 601 and the memory controller 603.

When the function module 600 includes the communication module 609, the electronic apparatus 60 of FIG. 17 may be a portable communication apparatus such as a wireless communication terminal. When the function module 600 may include the image sensor 611, the electronic apparatus 60 may be a digital camera, a digital camcorder, or an electronic system (for example, a personal computer (PC), a laptop computer, a mobile communication terminal, and the like) to which any one of the digital camera and the digital camcorder is attached.

The electronic apparatus 60 may also include both the communication module 609 and the image sensor 611.

An electronic apparatus 70 illustrated in FIG. 18 may include a card interface 701, a memory controller 703, and a nonvolatile memory apparatus 705.

FIG. 18 is an illustrative diagram illustrating the electronic apparatus 70 used as a memory card or a smart card, and the electronic apparatus 70 illustrated in FIG. 18 may be any one among a PC card, a multimedia card, an embedded multimedia card, a secure digital card, and a universal serial bus (USB) drive.

The card interface 701 may perform interacting on data exchange between a host and the memory controller 703 according to a protocol of the host. In an embodiment, the card interface 701 may refer to hardware which may support a protocol used in the host, software installed in the hardware which may support the protocol used in the host, or a signal transmission method.

The memory controller 703 may control data exchange between the nonvolatile memory apparatus 705 and the card interface 701.

The nonvolatile memory apparatus 705 may employ the nonvolatile memory apparatus 10 illustrated in FIG. 1 and may include the resistance compensation circuit 160 and 20. Accordingly, the resistance compensation circuit 160 and 20 may compensate a wiring resistance of a memory cell to be accessed based on an address signal of the memory cell.

The above embodiments of the present disclosure are illustrative and not limitative. Various alternatives and equivalents are possible. The embodiments are not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A nonvolatile memory apparatus comprising:
    a memory cell array including a plurality of memory cells coupled between a plurality of word lines and a plurality of bit lines; and
    a resistance compensation circuit configured to generate a compensation resistance value according to a position of a memory cell to be accessed and provide the compensation resistance value to a corresponding word line and a corresponding bit line,
    wherein the memory cell array is divided into a plurality of regions in a word line direction and a bit line direction, and
    the resistance compensation circuit is configured to generate the compensation resistance value based on a region determination signal according to the position of the memory cell to be accessed.

2. The nonvolatile memory apparatus of claim 1, further comprising:
    a row selection circuit configured to select at least one among the plurality of word lines based on a row address signal; and
    a column selection circuit configured to select at least one among the plurality of bit lines based on a column address signal,
    wherein the resistance compensation circuit is configured to generate the compensation resistance value in inverse proportion to distances from the row selection circuit and the column selection circuit.

3. The nonvolatile memory apparatus of claim 2, wherein the resistance compensation circuit is configured to generate a compensation resistance value of a word line side in inverse proportion to the distance from the row selection circuit and generate a compensation resistance value of a bit line side in inverse proportion to the distance from the column selection circuit.

4. The nonvolatile memory apparatus of claim 1, wherein the resistance compensation circuit is configured to include a resistance providing unit of which a resistance value is determined according to the position of the memory cell to be accessed.

5. The nonvolatile memory apparatus of claim 1, wherein the resistance compensation circuit is configured to include a plurality of wirings of which resistance values are determined according to the position of the memory cell to be accessed.

6. The nonvolatile memory apparatus of claim 1, wherein the memory cell array includes a plurality of dummy cell lines, and
    the resistance compensation circuit is configured to vary resistances of the plurality of dummy cell lines according to the position of the memory cell to be accessed.

7. The nonvolatile memory apparatus of claim 1, wherein the memory cell array includes a plurality of dummy cell lines, and
    the resistance compensation circuit is configured to determine an electrical connection relation of the plurality of dummy cell lines according to the position of the memory cell to be accessed.

8. The nonvolatile memory apparatus of claim 1, wherein the word line is a global word line which has an electrically shorted portion, and the resistance compensation circuit is configured to be electrically coupled to the shorted portion of the global word line.

9. The nonvolatile memory apparatus of claim 1, wherein the bit line is a global bit line which has an electrically shorted portion, and the resistance compensation circuit is configured to be electrically coupled to the shorted portion of the global bit line.

10. The nonvolatile memory apparatus of claim 1, wherein the memory cells each comprise:

a storage node; and access element coupled in series with the storage node, wherein the storage node is configured with a material of which a resistance value is changeable according to an applied current amount.

11. A nonvolatile memory apparatus comprising:

a global word line which extends from a row selection circuit and has a shorted portion coupled to a memory cell array;

a global bit line which extends from a read/write circuit and has a shorted portion coupled to the memory cell array; and a resistance compensation circuit configured to be electrically coupled to the shorted portion of the global word line and the shorted portion of the global bit line and generate a compensation resistance value according to a position of a memory cell to be accessed.

12. The nonvolatile memory apparatus of claim 11, wherein the resistance compensation circuit is configured to generate a compensation resistance value of a word line side in inverse proportion to a distance from the row selection circuit and generate a compensation resistance value of a bit line side in inverse proportion to a distance from the read/write circuit.

13. The nonvolatile memory apparatus of claim 11, wherein the memory cell array includes a plurality of dummy cell lines, and the resistance compensation circuit is configured to generate the compensation resistance value by varying resistances of the plurality of dummy cell lines according to the position of the memory cell to be accessed.

14. The nonvolatile memory apparatus of claim 11, wherein the memory cell comprise:

a storage node; and access element coupled in series with the storage node, wherein the storage node is configured with a material of which a resistance value is changeable according to an applied current amount.

15. A resistance compensation circuit comprising:

a decoding circuit configured to determine a position of a memory cell to be accessed by receiving an address signal;

a control signal generation circuit configured to generate a first control signal and a second control signal based on an output signal of the decoding circuit;

a switching circuit configured to allow a compensation resistance value to be generated through a resistance providing unit based on the first control signal; and a selection circuit configured to provide the compensation resistance value to a wiring of the memory cell to be accessed based on the second control signal.

16. The resistance compensation circuit of claim 15, wherein the switching circuit is configured to generate a compensation resistance value of a word line side in inverse proportion to a distance from a row selection circuit for selecting a word line of the memory cell and generate a compensation resistance value of a bit line side in inverse proportion to a distance from a column selection circuit for selecting a bit line of the memory cell.

17. The resistance compensation circuit of claim 15, wherein the memory cell array including the memory cell is divided into a plurality of regions in a word line direction and a bit line direction, the decoding circuit is configured to generate a region determination signal according to the position of the memory cell to be accessed, and the control signal generation circuit is configured to generate the first control signal and the second control signal based on the region determination signal.

18. The resistance compensation circuit of claim 15, wherein the resistance providing unit is configured to include a plurality of wirings of which resistance values are determined according to the position of the memory cell to be accessed.

19. The resistance compensation circuit of claim 15, wherein the memory cell array including the memory cell includes a plurality of dummy cell lines, and the resistance providing unit is configured to include the plurality of dummy cell lines.

20. The resistance compensation circuit of claim 15, further comprising:

a first decoder configured to generate a region determination signal of a word line side based on a row address signal;

a first switching signal generation unit configured to generate a first switching signal based on the region determination signal of the word line side;

a first selection signal generation unit configured to generate a first selection signal based on the region determination signal of the word line side;

a first switching unit configured to generate a compensation resistance value of the word line side through the resistance providing unit based on the first switching signal; and a first selection unit configured to provide the compensation resistance value of the word line side to a word line of the memory cell to be accessed based on the first selection signal.

21. The resistance compensation circuit of claim 15, further comprising:

a second decoder configured to generate a region determination signal of a bit line side based on a column address signal;

a second switching signal generation unit configured to generate a second switching signal based on the region determination signal of the bit line side;

a second selection signal generation unit configured to generate a second selection signal based on the region determination signal of the bit line side;

a second switching unit configured to generate a compensation resistance value of the bit line side through the resistance providing unit based on the second switching signal; and a second selection unit configured to provide the compensation resistance value of the bit line side to a bit line of the memory cell to be accessed based on the second selection signal.

* * * * *